United States Patent [19]
Katakura

[11] Patent Number: 6,081,166
[45] Date of Patent: Jun. 27, 2000

[54] VOLTAGE CONTROLLED OSCILLATOR INCLUDING A PLURALITY OF BUFFER CIRCUITS DIODES, CURRENT SOURCES, MIS CAPACITORS

[75] Inventor: Masayuki Katakura, Kanagawa, Japan

[73] Assignee: Sony Corporation, Tokyo, Japan

[21] Appl. No.: 09/134,356

[22] Filed: Aug. 14, 1998

[30] Foreign Application Priority Data

Aug. 21, 1997 [JP] Japan ..................................... 9-224756

[51] Int. Cl.[7] .............................. H03B 5/24; H03L 7/099
[52] U.S. Cl. ......................... 331/57; 331/34; 331/177 R; 327/280; 327/281
[58] Field of Search .................................. 331/57, 177 R, 331/34; 327/274, 280, 281, 287, 288; 330/252, 253

[56] References Cited

U.S. PATENT DOCUMENTS

| | | |
|---|---|---|
| 4,876,519 | 10/1989 | Davis et al. ............................... 331/57 |
| 5,136,258 | 8/1992 | Nicollini et al. .......................... 330/253 |
| 5,521,558 | 5/1996 | Wilhelm et al. .......................... 331/57 |

*Primary Examiner*—David Mis
*Attorney, Agent, or Firm*—Ronald P. Kananen; Rader, Fishman & Grauer

[57] ABSTRACT

A voltage controlled oscillator which causes little interference to and receives little interference from other circuits via a parasitic capacitance of an integrated capacitor, has a good control linearity, and is capable of being used over a wide range of frequency including ultra high frequencies, constituting a ring oscillator by being provided with three or more logic buffer circuits having differential input and output terminals cascade connected at the differential inputs and outputs and making the n-th differential output a negative feedback to the terminal of the 1st differential input. Each of the logic buffer circuits comprises a differential transistor pair comprised of first and second transistors, first and second diode array each comprising at least one diode, first and second integrated capacitors, and a current source for frequency control. The sum of emitter currents of the pair of the differential transistors is set by the current source for frequency control. The collector terminals are connected to the first and second diode arrays and terminals of the first and second integrated capacitors.

10 Claims, 20 Drawing Sheets

FIG. 8

| NUMBER OF DIODE | NUMBER OF STAGES OF RING COUNTER LOGIC BUFFER | | | |
|---|---|---|---|---|
| | n = 3 | n = 4 | n = 5 | n = 6 |
| m = 2 | | 72mVp-p<br>0.49 | 102mVp-p<br>0.33 | 122mVp-p<br>0.25 |
| m = 3 | 75mVp-p<br>0.92 | 130mVp-p<br>0.52 | 170mVp-p<br>0.36 | 195mVp-p<br>0.26 |
| m = 4 | 110mVp-p<br>0.95 | 180mVp-p<br>0.53 | 230mVp-p<br>0.37 | 260mVp-p<br>0.27 |

UPPER LINES : OSCILLATION AMPLITUDE

BOTTOM LINES : NORMALIZATION OSCILLATION FREQUENCY

G21

G22

G23

VA

VB

VA – VB

VA

VB

VA – VB

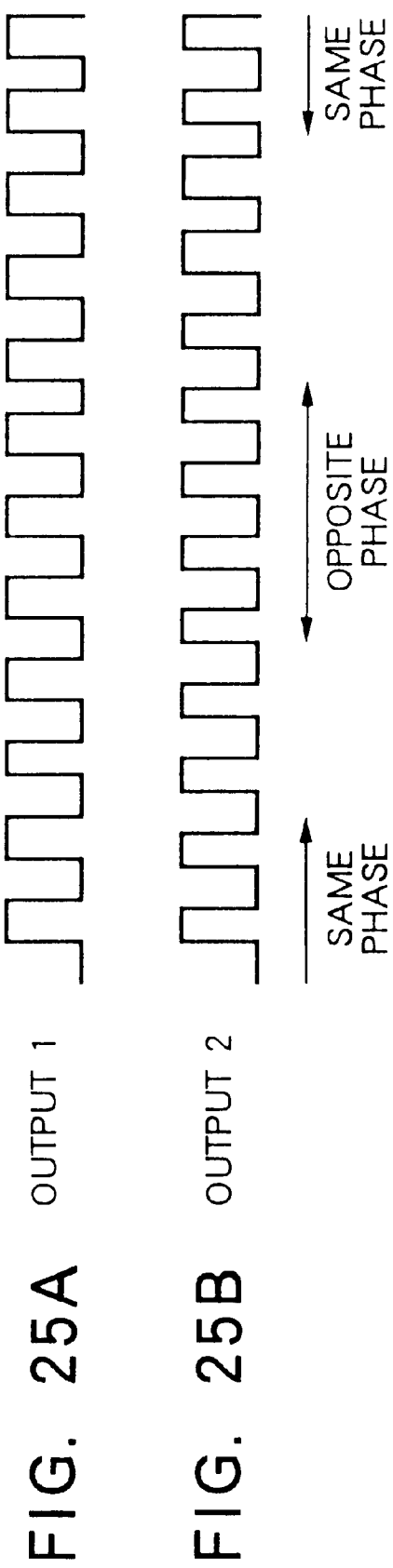

VOLTAGE CONTROLLED OSCILLATOR INCLUDING A PLURALITY OF BUFFER CIRCUITS DIODES, CURRENT SOURCES, MIS CAPACITORS

BACKGROUND OF THE INVENTION

1. Field of the Invention

The present invention relates to a voltage controlled oscillator used for a phase locked loop (PLL) circuit etc.

2. Description of the Related Art

A voltage controlled oscillator is an essential circuit for making a PLL.

In particular, in the recent various wireless, wire, and fiber optic types of communications systems, a voltage controlled oscillator capable of operating at a high speed with a small jitter and reduced phase noise is required in a PLL circuit for generating a frequency standard for modulation and demodulation and for extracting a clock signal.

Note that jitter and phase noise are just different ways of viewing the same fluctuation, that is, in a time domain or in a frequency domain, and mean substantially the same physical phenomenon.

General purpose voltage controlled oscillators can be divided roughly into an LC type and a CR type.

The LC type is set in oscillation frequency by an inductor (L) and a capacitor (C).

The CR type is set in oscillation frequency by a capacitor (C) and resistor (R) or an electric current.

The LC type has small jitter, however, the range of variation of the oscillation frequency is narrow and the inductor (L) has to be provided outside the IC chip.

The CR type offers a wide range of variation of the oscillation frequency and enables a good linearity to be obtained in the control characteristic of the frequency characteristic with respect to the control voltage.

Also, it is easy to integrate all of the necessary elements on an IC chip. However, there is a disadvantage that the jitter performance is inferior to that of the LC type.

Therefore, each type can be used in accordance with the specific application taking into consideration the respective advantages and disadvantages. The LC type is used mostly in wireless communications systems handling narrow band signals, while the CR type is often used in wire or fiber optic communications systems.

There are two leading types of voltage controlled oscillators of the CR type: an emitter-coupled multi-vibrator type and a ring oscillator type. These circuits of the related art generally have the following disadvantages. Improvement has been desired.

They cause interference in other circuits via a parasitic capacitance of the capacitor (C) with the IC substrate.

When other circuits send signals to the IC substrate and the potential of the signals fluctuate, it suffers from interference.

Due to the above two reasons, when two voltage controlled oscillators (VCO) exist on an IC chip, they interfere with each other.

When the range of variation of frequency control is extremely wide, the control linearity deteriorates.

The above disadvantages will be explained in more detail below.

FIG. 12 is a circuit diagram of a first example of an emitter-coupled multi-vibrator type voltage controlled oscillator of the related art.

This voltage controlled oscillator comprises npn-type transistors Q1 to Q4, resistors R1 and R2, a capacitor (integrated capacitor) C1, diodes D1 and D2, and current sources I1 to I4.

In the voltage controlled oscillator of FIG. 12, triangular waves having a peak-to-peak (p-p) value of about 2·VF (VF=forward voltage drop of a pn junction) are generated at the two terminals of the integrated capacitor C1 due to the action of the clamp diodes D1 and D2.

The slope of the triangular waves is determined by the integrated capacitor C1 and a control current IO, thus the oscillation frequency becomes proportional to the control current IO. The forward drop voltage of the clamp diodes D1 and D2 varies, strictly speaking, in accordance with the control current I0.

When the product of the resistors R1 and R2 and the control current IO is less than VF/2, the clamp diodes D1 and D2 lose their clamping function. Accordingly, the circuit no longer functions as a voltage controlled oscillator.

Therefore, the range of variation of the frequency of this circuit is not very wide and the control linearity is not that good.

FIG. 13 is a circuit diagram of a second example of an emitter-coupled multi-vibrator type voltage controlled oscillator of the related art improved over the circuit in FIG. 12.

This voltage controlled oscillator comprises npn-type transistors Q11 to Q18, resistors R11 to R14, a capacitor (integrated capacitor) C11, diodes D11 and D12, and current sources I11 to I17.

In the voltage controlled oscillator in FIG. 13, the amplitude of the triangular waves at the terminal of the integrated capacitor C11 can be made stabler basically by inserting a differential stage comprised of the transistors Q17 and Q18. comparing this circuit with the first example of the related art shown in FIG. 12, both the range of variation of the frequency and the control linearity are greatly improved.

However, there is a problem when the control current varies for example by a factor of 10. This is because although the amplitude between collectors of the transistors Q11 and Q12 changes according to the control current IO, if the amount of change is too great, it can no longer be covered by just the amplitude limiting action of the transistors Q17 and Q18.

Next, an explanation will be made of the other leading means of a CR type voltage controlled oscillator, that is, a ring oscillator type voltage controlled oscillator, of the related art.

FIGS. 14A to 14D are views for explaining the principle of the ring oscillator type voltage controlled oscillator.

This circuit is structured to connect n stages of logic buffer circuits and to return signals in order to give negative feedback from the output to input.

The oscillation frequency fosc becomes $1/(2 \cdot tpd)$. Here, tpd is a propagation delay time of the logic buffer circuit.

In the circuit in FIG. 14A, three logic buffer circuits G21 to G23 having differential input/outputs are used. In the case of differential input/outputs, there is no limit on the number n of the stages. In the case of a single end inverter (inversion circuit), the number n has to be an odd number to obtain negative feedback. Generally three or more stages are used. The reason will be explained later.

FIG. 15 is a circuit diagram of a first example of a ring oscillator type voltage controlled oscillator of the related art.

This circuit comprises npn-type transistors Q31 to Q42, resistors R31 to R36, and current sources I31 to I39.

In the voltage controlled oscillator in FIG. 15, three differential buffers having emitter followers are connected in series. The current sources I31 to I33 of the current Ix are for the differential buffers, while the current sources I34 to I39 of the current Iy are for the emitter followers. When using this circuit as a voltage controlled oscillator, however, the current Ix is fixed and the current Iy is changed to change the propagation delay time.

The circuit shown in FIG. 15 oscillates at a considerably high frequency and has a considerably poor control linearity as shown in FIG. 16.

The reason for the poor linearity is that the propagation delay time tpd becomes longer by the amount of reduction of the control current Iy, but even when increasing it, the delay of the differential stage becomes dominant. In the end, the propagation delay time tpd does not become short much at all.

FIG. 17 is a circuit diagram of a second example of a ring oscillator type voltage controlled oscillator improved over the related art shown in FIG. 15.

This circuit is structured with the capacitors C31 to C33 inserted between the emitters of the transistors Q33 and Q34, Q37 and Q38, and Q41 and Q42 constituting the differential emitter follower.

The circuit of FIG. 17 can be used from a relatively low frequency. The propagation delay time tpd is determined by the capacitors C31 to C33 and the control current Iy, and the control linearity is improved.

The above explanation was made concerning the operation and specific examples of the leading types of RC type voltage controlled oscillators, that is, the emitter-coupled multi-vibrator type and the ring oscillator type.

Next, the problems in the related art will be explained.

First, the biggest problem is that interference is caused in and received from other circuits via the parasitic effects of the integrated capacitors.

FIG. 18 shows a metal insulator semiconductor (MIS) capacitor as a typical structure of a capacitor in an IC.

This MIS capacitor is formed by sandwiching a dielectric comprised of a nitride film 5 by an N+ silicon layer 4 and an aluminum (Al) integration layer 6.

However, a parasitic junction capacitance is formed with a p-type substrate 1 on the silicon side of the capacitor. Namely, the circuit becomes the equivalent circuit as shown in FIG. 19.

Recently, a capacitor of a structure with a dielectric called an MIM capacitor sandwiched by metal on at the two electrodes has been developed. In so far as the substrate is not an insulating substrate such as GaAs, generation of some kind of parasitic capacitance, though large or small in value, cannot be avoided. In a capacitor of the MIS structure, there is a parasitic capacitance of about 1/10 of the capacitance C.

The circuits of the related art explained with reference to FIGS. 12, 13, and 17 perform complete differential operations. When there is a parasitic capacitance in the integrated capacitors used by such circuits, the balance of the circuit operation is lost.

Taking as an example the voltage controlled oscillator of the emitter-coupled multi-vibrator type of FIG. 12, the integrated capacitor C1 has been constructed, as shown in FIG. 20, by connecting two MIS capacitors by antiparallel connection so as to make the parasitic capacitance enter symmetrically and prevent the loss of the balanced operation.

Next, the waveforms of the capacitor terminals A and B will be considered. When the voltages of the capacitor terminals are VA and VB, the waveforms become as shown in FIGS. 21A to 21C.

The waveforms of the terminals A and B of the integrated capacitor C31 in the case of the ring oscillator type circuit shown in FIG. 17 are shown in FIGS. 22A to 22C.

At the integrated capacitor terminals, triangular waves are generated in the case of the emitter-coupled multi-vibrator type, while trapezoidal waves are generated in the case of the ring oscillator type. When the waveforms are inverted, the voltage of the terminals of the integrated capacitor rises sharply.

Due to this rise, a considerably large spike current flows into the IC substrate via the parasitic capacitance. This is shown in FIG. 23.

This spike current makes the potential in the IC substrate fluctuate.

The spike current also flows to the Vcc terminal and the GND terminal and causes interference in other circuits via the limited impedance.

Further, this parasitic capacitance makes the voltage controlled oscillator susceptible to interference from other circuits.

Assume that there is another voltage controlled oscillator and that the first voltage controlled oscillator injects a spike current to the IC substrate. Due to this, the potential of the substrate immediately under the second voltage controlled oscillator fluctuate to certain extent. As a result, the current is injected to the circuit via the parasitic capacitance as shown in FIG. 24.

This causes a major problem especially when the oscillation frequencies of the two voltage controlled oscillators are close. An example of this can be seen for example in the PLLs on the write side and the read side of a hard disk storage device. The write side PLL determines the timing for the circuit to perform a write operation.

As opposed to this, the read side PLL extracts a clock from the signals read from the disk. Therefore, the PLL has to follow changes in the rotational speed of the disk and irregular rotation. Accordingly, there is some fluctuation in the number of clocks.

When the two PLLs interfere with each other, their characteristics deteriorate. This phenomenon is not limited to hard disk storage devices and is widely known in the wireless communications field. When the frequencies of two PLL are close, such interference arises easily.

The reason for such interference will be explained with reference to FIGS. 25A and 25B.

When the outputs of two voltage controlled oscillators approach each other, the outputs become the same in phase or opposite in phase in some sections. How often this is repeated is determined by the difference of the two frequencies. Namely, the closer the two frequencies, the longer the period where the outputs become the same or opposite phase.

When there is interference between the two voltage controlled oscillators, the same interference is received over a long period. Accordingly, the oscillation cycle becomes unstable.

Since the phase is an integral of each cycle, even if the fluctuation per cycle is the same, the smaller the frequency difference, the greater the apparent effect in terms of jitter or phase noise.

As explained above, the voltage controlled oscillators of the emitter-coupled multi-vibration type and the ring oscillator type have the disadvantage that interference arises between circuits via the parasitic capacitance of the integrated capacitors. Improvement has been desired.

This is caused because the integrated capacitor is used in a balanced state. A circuit used with one end grounded would not suffered from such a problem.

There are other types of voltage controlled oscillators with one end grounded used for low frequencies.

However, such circuits cannot be used or cannot provide sufficient characteristics in relatively high frequency (several MHz or more) applications where emitter-coupled multi-vibrator type and ring oscillator type voltage controlled oscillators excel.

Also, while these circuits can handle single-digit multiple ranges of variation of frequencies of the single-digit order, they had difficulty handling double-digit multiple ranges.

In the emitter-coupled multi-vibrator type shown in FIGS. 12 and 13, the operation mode of the circuit changes if the control current changes too much.

The ring oscillator type shown in FIG. 15 inherently has an extremely poor control linearity.

The ring counter type shown in FIG. 17 has a considerably good linearity, but also runs into problems when the control current Iy changed too much.

On the high frequency side where the control current Iy is large, the propagation delay time of the differential buffer itself appears and the oscillation frequency becomes saturated.

Conversely, on the low frequency side where the control current Iy is small, the base current of the differential buffer is no longer negligible compared with the control current Iy and again the control linearity is deteriorated.

SUMMARY OF THE INVENTION

An object of the present invention is to provide a voltage controlled oscillator which seldom causes interference in or receives interference from other circuits via a parasitic capacitance component of the integrated capacitors, has a good control linearity, and can be used up to ultra high frequencies.

According to the present invention, there is provided a voltage controlled oscillator formed as a ring oscillator, comprising n (n≧3) number of logical buffer circuits having differential input terminals and differential output terminals wherein the i-th (1≦i<n) differential output terminal is connected to the i+1-th differential input terminal to form a cascade connection, and the n-th differential output terminal is made a negative feedback to the 1st differential input terminal, wherein each logical buffer circuit comprises a differential transistor pair comprised of a first transistor and a second transistor, a first diode array comprised of m (m≧1) number of diodes connected in series, a second diode array comprised of m number of diodes connected in series, a first integrated capacitor, a second integrated capacitor, and a current source for frequency control; base terminals of the first and second transistors constituting the differential transistor pair comprise a differential input, the sum of the emitter currents is set by the current source for frequency control, the collector terminals are connected to the first and second diode arrays and terminals of the first and second integrated capacitors while the other terminals thereof are alternating-current grounded.

Preferably, emitter terminals of the first and second transistors constituting the differential transistor pairs are connected to each other and a connection point thereof is connected to the current source for frequency control and the number m of diodes of the first and second diode arrays is two or more.

Preferably, the first and second integrated capacitors are metal insulator semiconductor (MIS) structure capacitors comprised of a metal film and silicon bulk sandwiching an insulating film wherein the metal film is connected to the collector electrode side of the first or second transistor, and the silicon bulk side is the alternating-current grounded.

Preferably, further provision is made of a first current source supplying a current which is proportional to the current source for frequency control and has a value not more than one-half of the same and connected in parallel to the first diode array and a second current source supplying a current which is proportional to the current source for frequency control and has a value not more than one-half of the same and connected in parallel to the second diode array.

Preferably, further provision is made of a third transistor and a fourth transistor, a collector electrode of the third transistor being connected to a base electrode of the fourth transistor and an emitter electrode of the first transistor, a collector electrode of the fourth transistor being connected to a base electrode of the third transistor and an emitter electrode of the second transistor, and emitter electrodes of the third and fourth transistors being connected to each other and a connection point thereof being connected to the current source for frequency control.

Preferably, the number m of diodes of the first and second diode arrays is two or more.

In a ring oscillator type voltage controlled oscillator according to the present invention, a logic buffer circuit comprising the ring comprises emitter-coupled differential transistors having serial circuits of diodes as a load, so interference with other circuits via the parasitic capacitance of the MIS structure capacitor becomes extremely small.

BRIEF DESCRIPTION OF THE DRAWINGS

These and other objects and features of the present invention will become clearer from the following description of the preferred embodiments given with reference to the accompanying drawings, in which:

FIG. 8 is a view of an oscillation amplitude and a normalized oscillation frequency in the case where the number n of logic buffer circuits and the number m of serial diodes of a ring oscillator are used as parameters;

FIGS. 25A and 25B are views for explaining the reasons why interference easily arises when the frequencies of two PLLs are close.

DESCRIPTION OF THE PREFERRED EMBODIMENTS

Below, preferred embodiments will be described with reference to the accompanying drawings.

Figure 1:
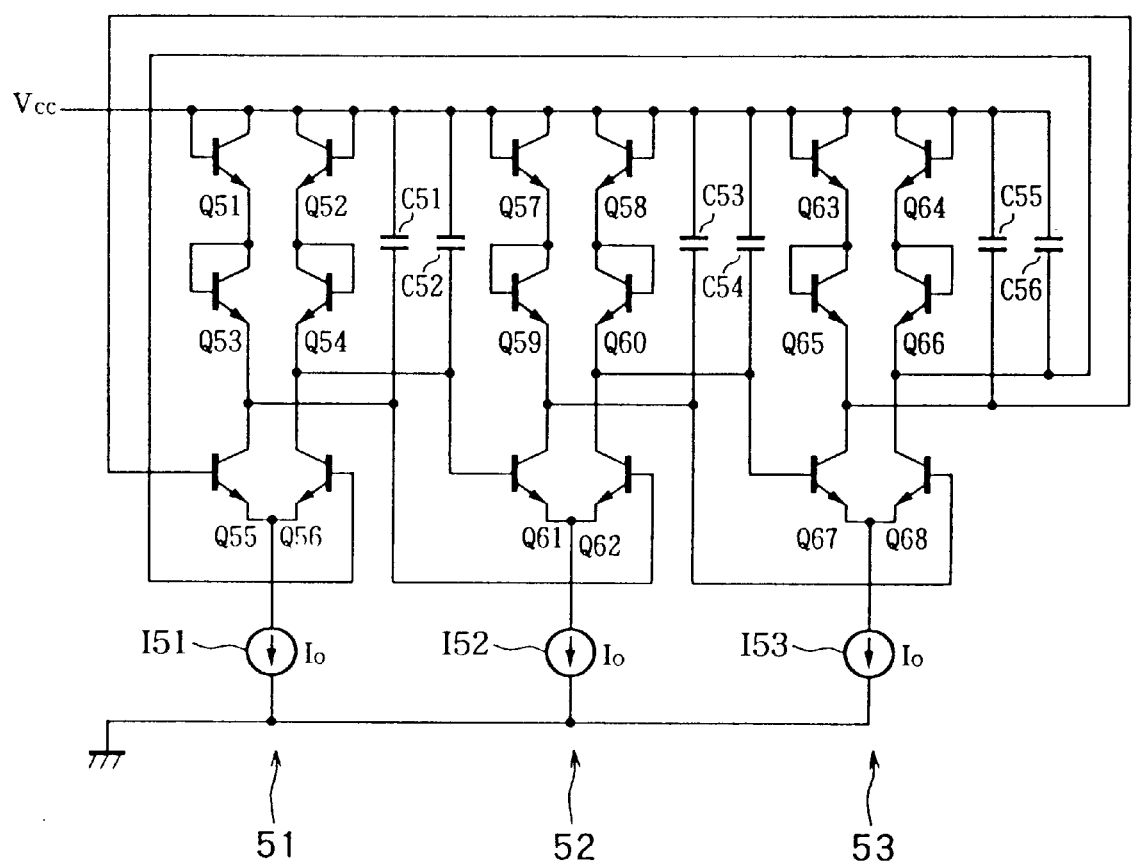
FIG. 1 is a circuit diagram of a voltage controlled oscillator according to a first embodiment of the present invention.
Figure 2:
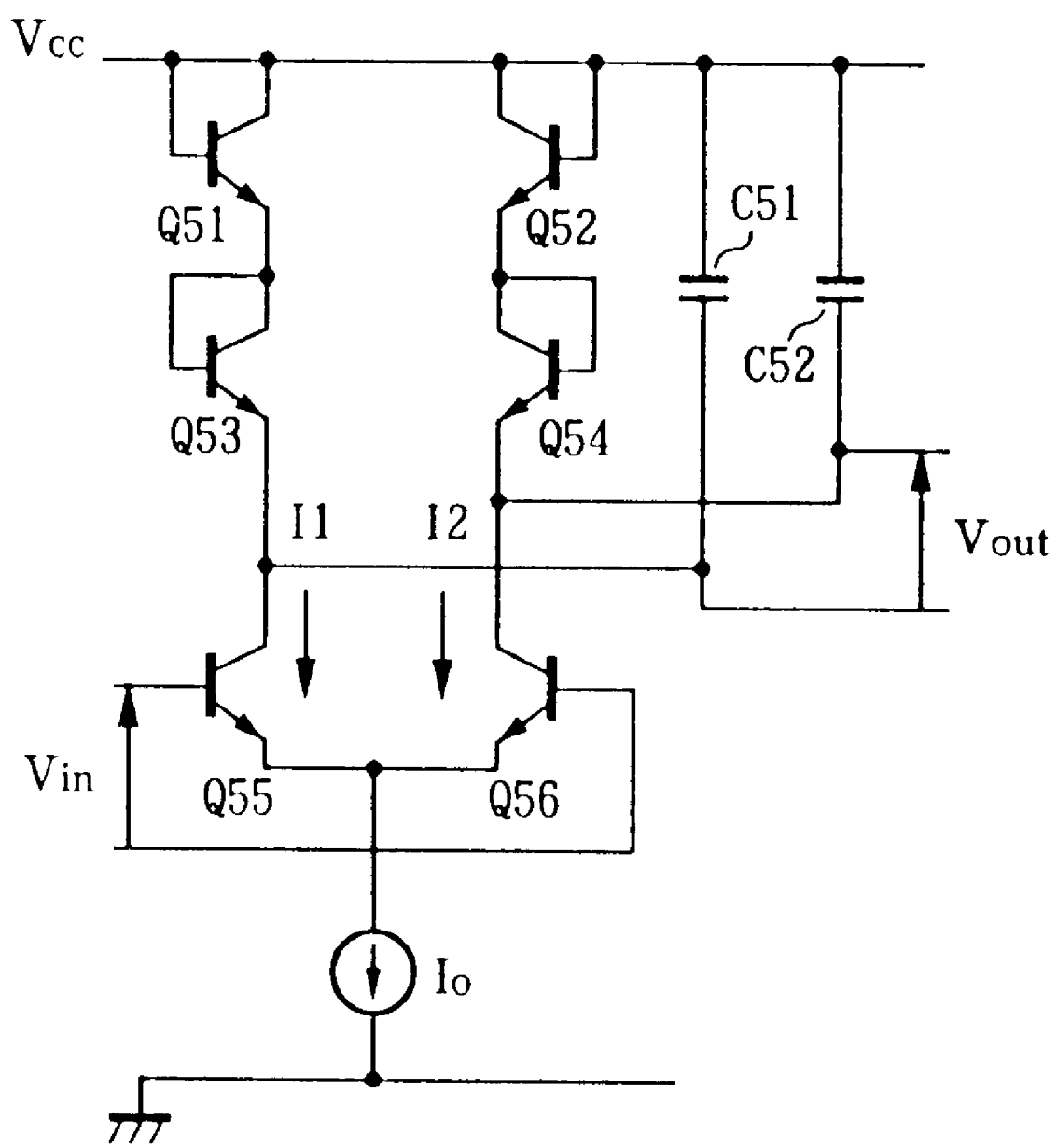
FIG. 2 is a circuit diagram of one of the logic buffer circuits in the circuit of FIG. 1.

FIG. 1 is a circuit diagram of a voltage controlled oscillator according to a first embodiment of the present invention. FIG. 2 is a view of one of the logic buffer circuits of FIG. 1.

This voltage controlled oscillator 50, as shown in FIG. 1, comprises n number of (three in this embodiment) logic buffer circuits 51, 52, and 53 having differential input and output terminals. The differential output terminal of the i-th stage is connected to the differential input terminal of the i+1 stage in order to comprise a cascade connection, while the differential output of the n-th stage is made a negative feedback to the differential input terminal of the first stage, whereby a ring oscillator circuit is comprised.

The logic buffer circuit 51 comprises npn-type transistors Q51 to Q56, first and second integrated capacitors C51 and C52, and a current source I51 for frequency control.

The logic buffer circuit 51 has first and second diode arrays comprised of diode-connected transistors Q51 and Q53 and diode-connected transistors Q52 and Q54 connected in series as loads to the collectors of the differential transistors Q55 and Q56 serving as the emitter-coupled first and second transistors. Further, first and second integrated capacitors C51 and C52 are connected in parallel to the diode arrays connected between the supply line of the power source voltage Vcc and the collectors of the transistors Q55 and Q56. The connecting point of the emitters of the transistors Q55 and Q56 is connected to the current source I51.

A differential input is constituted by the base terminals of the first and the second transistors Q55 and Q56 comprising the differential transistor pair.

The logic buffer circuit 52 comprises npn-type transistors Q57 to Q62, integrated capacitors C53 and C54, and the current source I52 for frequency control.

The logic buffer circuit 52 has first and second diode arrays comprised of diode-connected transistors Q57 and Q59 and diode-connected transistors Q58 and Q60 connected in series as loads to the collectors of the differential transistors Q61 and Q62 serving as the emitter-coupled first and second transistors. Further, first and second integrated capacitors C53 and C54 are connected in parallel to the diode arrays connected between the supply line of the power source voltage Vcc and the collectors of the transistors Q61 and Q62. The connecting point of the emitters of the transistors Q61 and Q62 is connected to the current source I52.

A differential input is constituted by the base terminals of the first and the second transistors Q61 and Q62 comprising the differential transistor pair. This is connected to the collectors of the transistors Q55 and Q56 of the logic buffer circuit 51.

The logic buffer circuit 53 has first and second diode arrays comprised of diode-connected transistors Q63 and Q65 and diode-connected transistors Q64 and Q66 connected in series as loads to the collectors of the differential transistors Q67 and Q68 serving as the emitter-coupled first and second transistors. Further, first and second integrated capacitors C55 and C56 are connected in parallel to the diode arrays connected between the supply line of the power source voltage Vcc and the collectors of the transistors Q67 and Q68. The connecting point of the emitters of the transistors Q67 and Q68 is connected to the current source I53.

A differential input is constituted by the base terminals of the first and the second transistors Q67 and Q68 comprising the differential transistor pair and is connected to the collectors of the transistors Q61 and Q62 of the logic buffer circuit 52.

The collectors of the transistors Q67 and Q68 are connected, that is, fed back, to the base terminals of the differential transistors Q55 and Q56 of the logic buffer circuit 51.

Next, consideration will be made of the relationships between an input voltage Vin and an output voltage Vout of the logic buffer circuit having the above configuration by taking as an example the logic buffer circuit 51 shown in FIG. 2.

The collector currents I1 and I2 of the transistors Q55 and Q56 are given by the following formulas:

$$I1 = Io\left\{1 - \frac{1}{1+\exp(Vin/VT)}\right\} \quad (1)$$

$$I2 = Io\frac{1}{1+\exp(Vin/VT)} \quad (2)$$

Here, VT(=kT/Q) indicates the thermal voltage, which is about 26 mV at room temperature. Here, k indicates a Boltzmann constant, T indicates the absolute temperature, and q indicates an element charge.

The output voltage Vout can be given in terms of direct current by the following formula. Here, Is indicates a saturation current.

$$V_{out} = VT \cdot \ln(I1/Is) - VT \cdot \ln(I2/Is) \qquad (3)$$

If formulas 1 and 2 are inserted into formula 3, the extremely simple result can be obtained that the output voltage Vout becomes twice of the input voltage Vin, as shown in the following formula.

$$V_{out} = 2 \cdot V_{in} \qquad (4)$$

The conditions for a ring oscillator type voltage controlled oscillator to oscillate at a certain frequency f0 are described below.

The phase shift at f0 is 180/n (n=number of stages of ring).

The small signal gain at f0 exceeds "1" and becomes "1" at a predetermined oscillation amplitude by the non-linear effect of the circuit.

Formula 4 has a constant gain regardless of the amplitude so that it appears that this circuit does not act to limit the amplitude in the direct current.

However, in a limited frequency, this circuit acts to limit the frequency due to the effects of the capacitors C51 and C52. That is, the following can be considered.

The maximum values able to be taken by the collector currents I1 and I2 are rectangular waves with p-p (peak to peak) values of Io. If all of the alternating current component of the current flows into the capacitors C51 and C52, the output voltage Vout becomes a triangular wave whose p-p value is as given in the following formula:

$$V_{out}(p - p) = \frac{Io}{2 \cdot C \cdot fo} \qquad (5)$$

In actuality, since current flows to the first and second diode arrays, the output voltage Vout should becomes smaller than this. In this way, there is an amplitude limiting action at a limited frequency. Therefore it can be expected that the circuit will oscillate at a constant amplitude.

However, it is very difficult to analytically find the value taken by the amplitude because of the nonlinear operation of the diode arrays.

Next, a phase shift will be considered.

Figure 3:
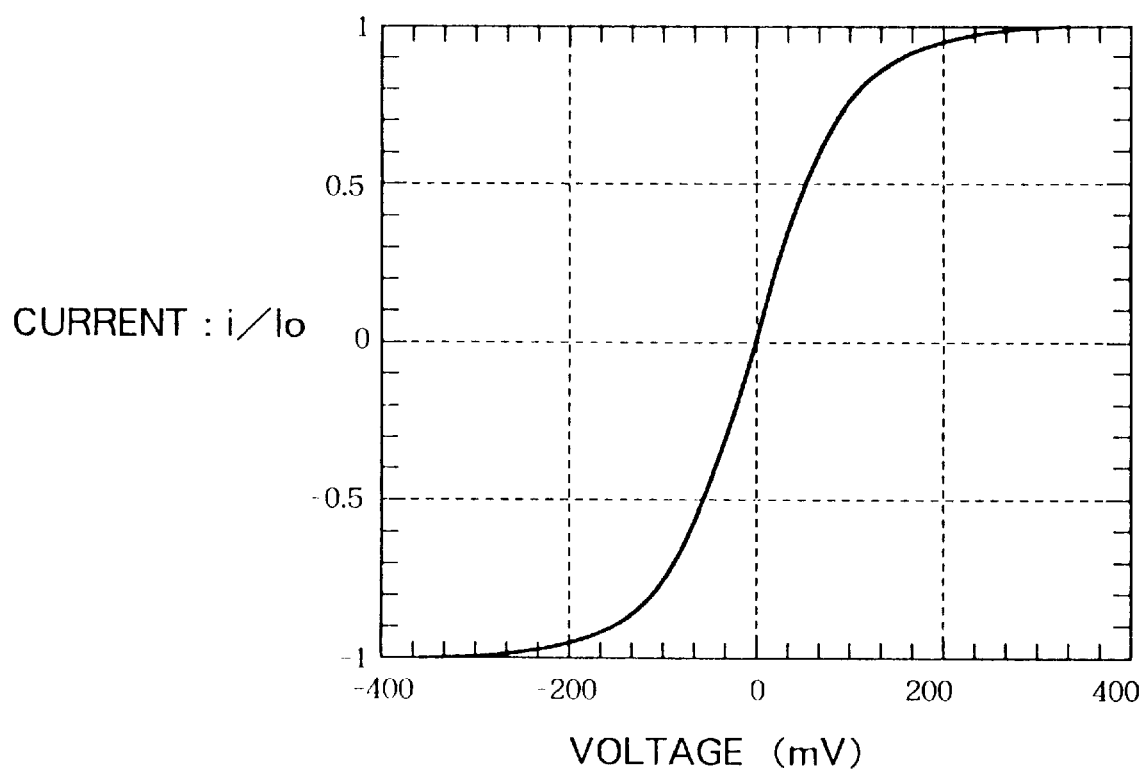
FIG. 3 is a view of the V-I (voltage-current) characteristic of a diode array.

FIG. 3 is a view of the V-I (voltage-current) characteristic of the diode arrays. In the figure, the abscissa indicates a voltage corresponding to Vout, and the ordinate indicates a difference of the collector currents of the transistors Q55 and Q56.

$$i = I1 - I2 \qquad (6)$$

The equivalent resistance rd of the diode array when the output voltage is low is obtained from a tangent of the center portion of FIG. 3. It can be expressed by the following formula.

$$rd = 8 \cdot VT/Io \qquad (7)$$

Here, the amount of the phase shift φ of the one logic buffer circuit 51 shown in FIG. 2 can be expressed as follows.

$$\phi = \tan^{-1}\left(\frac{rd}{\pi \cdot f \cdot C}\right) = \tan^{-1}\left(\frac{8 \cdot VT}{\pi \cdot f \cdot C \cdot Io}\right) \qquad (8)$$

here, rd indicates the equivalent resistance, f indicates a frequency, C indicates the capacity, VT indicates the thermal voltage, and Io indicates the control current.

The actual output amplitude is larger than the straight line region of the characteristic shown in FIG. 3. From the viewpoint of the jitter and the phase noise, it is preferable to make the amplitude wider. In such a case, the equivalent resistance becomes larger than in formula 7, and, along with that, the amount of the phase shift at the same frequency becomes larger than in formula 8. However, it is again difficult to obtain the value by analysis.

Therefore, the oscillation conditions are obtained by numerical analysis.

Figure 4:
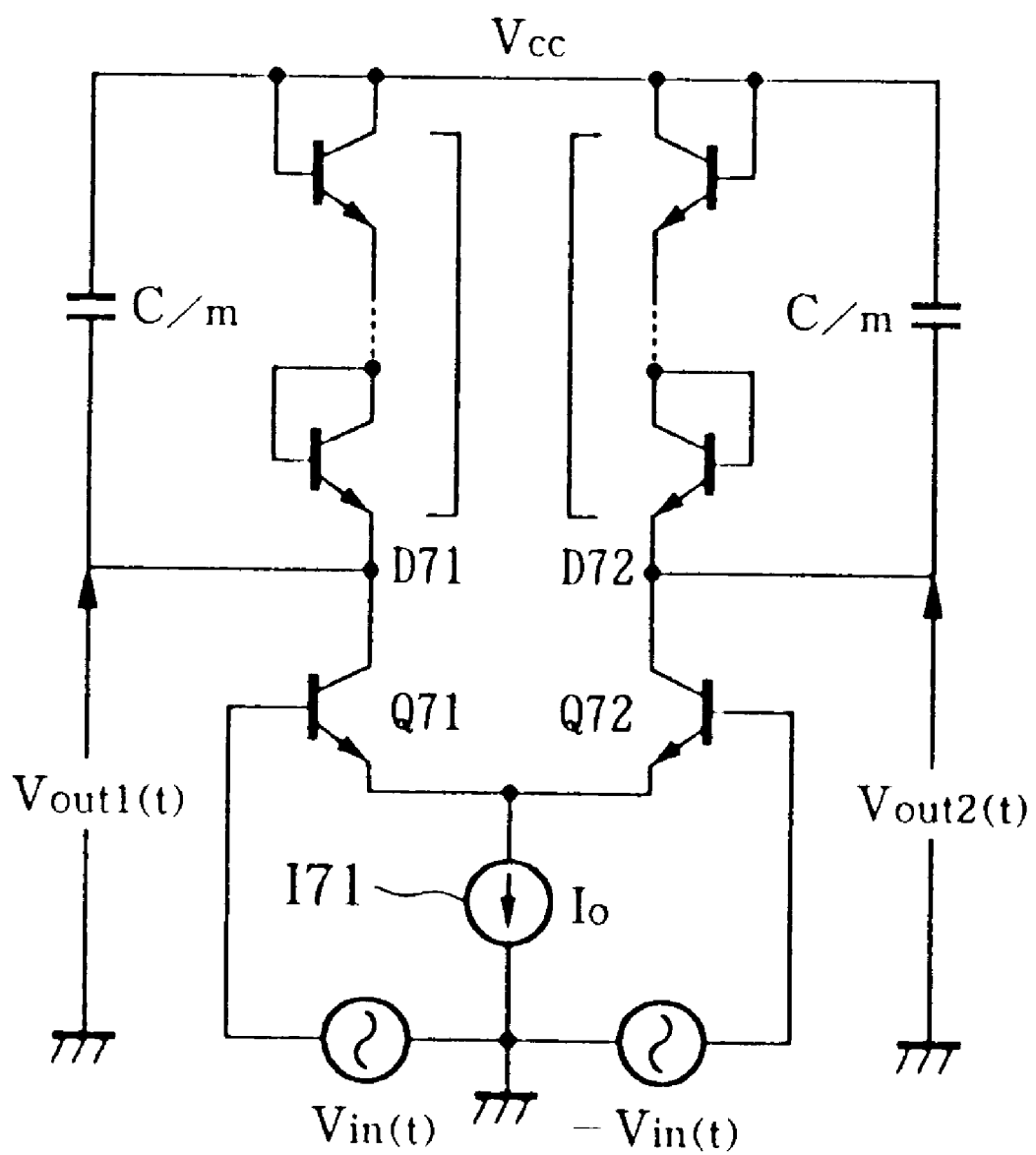
FIG. 4 is a view of an analysis circuit when finding oscillation conditions by numerical analysis.

FIG. 4 shows the analyzing circuit for this.

In this circuit, the first and the second diode arrays D71 and D72, comprising m numbers of diodes connected in series to the emitter-coupled differential transistor pair Q71 and Q72, are connected.

The vin(t) shown in the following formula is applied between the bases of the transistors Q71 and Q72.

$$vin(t) = \frac{Vip - p}{2} \sin(2\pi ft) \qquad (9)$$

The capacitors C/m are connected in parallel to the diode arrays D71 and D72. The capacitor C/m is normalized so that the time constant with the differentiation resistance of the diode arrays D71 and D72 becomes a unit frequency.

$$C = \frac{1}{4\pi \cdot VT \cdot Io} \qquad (10)$$

When increasing the input amplitude Vip-p at a certain frequency under such conditions, the amplitudes of the output voltages vout1(t) and vout2(t) eventually become saturated due to the nonlinearity of the pair of emitter-coupled differential transistors Q71 and Q72. That is, the gain is reduced.

One of the oscillation conditions is that the gain of the logic buffer circuits comprising the ring effectively becomes 1. Therefore, it is sufficient to find those conditions.

When supplying a sine wave as an input, the output actually becomes a somewhat deviated waveform, however, the effect is not too large.

The number m of serial diodes of the diode arrays D71 and D72 is set between 2 and 4 here. If m is 1, the circuit is unable to oscillate since the gain can only become 1 even with a small signal. On the contrary, if m is too large, a low voltage operation cannot be carried out.

Figure 5:
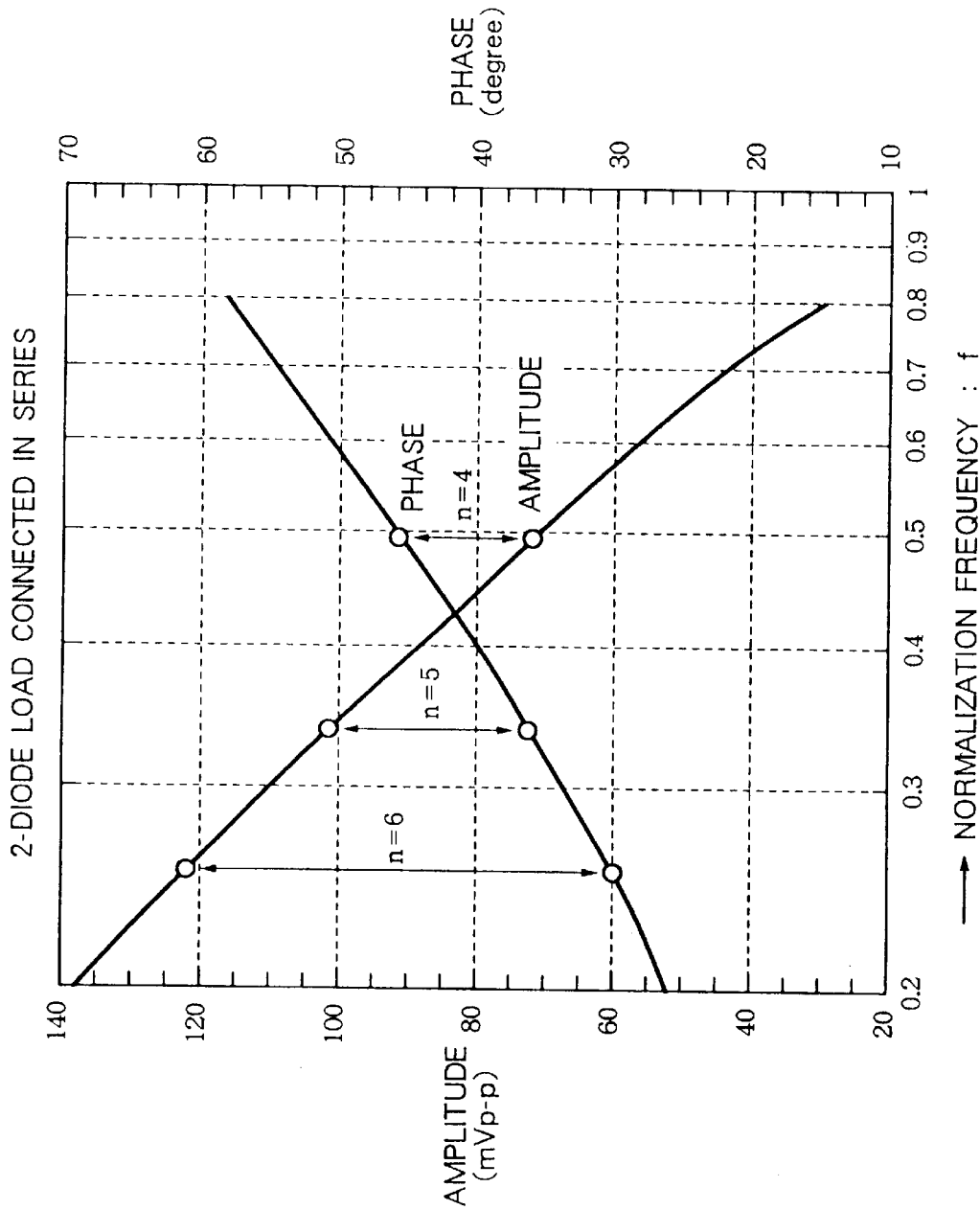
FIG. 5 is a view of the results of analysis in the case of two serial diodes in the circuit of FIG. 4.

FIG. 5 is a view of the result of analysis when there are two serial diodes in the circuit shown in FIG. 4.

The amplitude plotted shows the points where the input amplitude vip-p and the amplitude of the basic waveform of the output vout1(t) or vout2(t) become equal at a normalized frequency f, while the phase plotted shows the phase difference between the input and output at that time.

For example, when there are four logic buffer circuits in the ring, the phase difference between the input and output of each stage has to be 45 degree (=180/4), thus it is predicted from FIG. 5 that the oscillator will start oscillating when the frequency becomes about 0.49 and the amplitude becomes about 72 mVp-p.

In the same way, it is predicted that the oscillation frequency will be 0.33 and the amplitude will be 102 mVp-p in the case where there are five logic buffer circuits, and that the oscillation frequency will be 0.25 and the amplitude will be 122 mVp-p in the case where there are six logic buffer circuits.

When there are three logic buffer circuits, the range of the graph of FIG. 5 is exceeded. The amplitude becomes an extremely small 20 mVp-p or so which is not suitable for practical use from the viewpoints of the jitter and phase noise.

Figure 6:
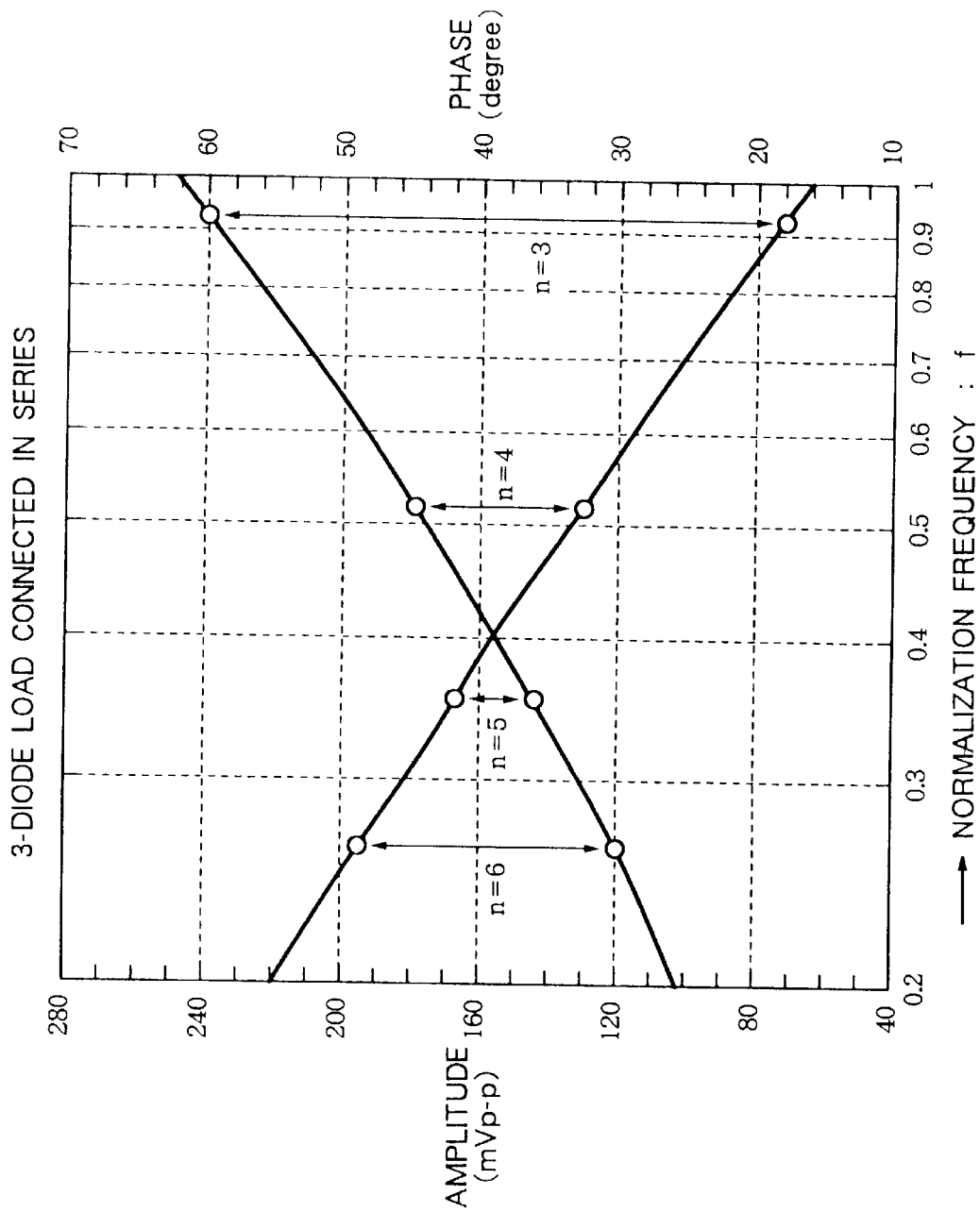
FIG. 6 is a view of the results of analysis in the case of three serial diodes.
Figure 7:
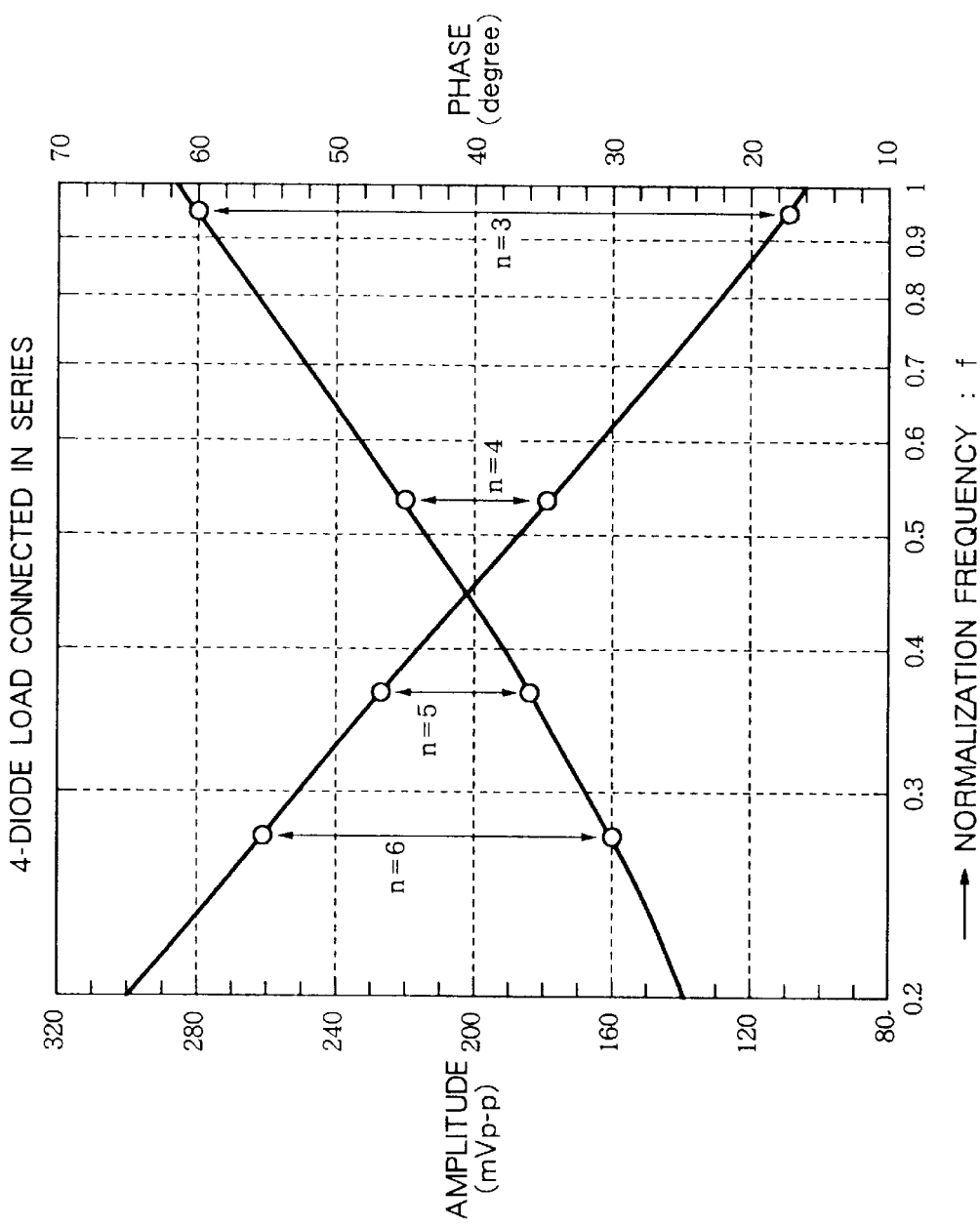
FIG. 7 is a view of the results of analysis in the case of four serial diodes.

FIG. 6 is a view of the result of analysis when there are three serial diodes, and FIG. 7 is a view of the result of analysis when there are four serial diodes.

FIG. 8 is a view of the oscillation amplitude and the normalized oscillation amplitude when using n number of logic buffer circuits of the ring oscillator and m number of serial diodes as parameters based on the results shown in FIGS. 6 and 7.

By utilizing this, it is possible to select the number m of serial diodes from the viewpoint of the operating voltage and to select the number n of the logic buffer circuits from the viewpoint of jitter and phase noise.

Figure 9:
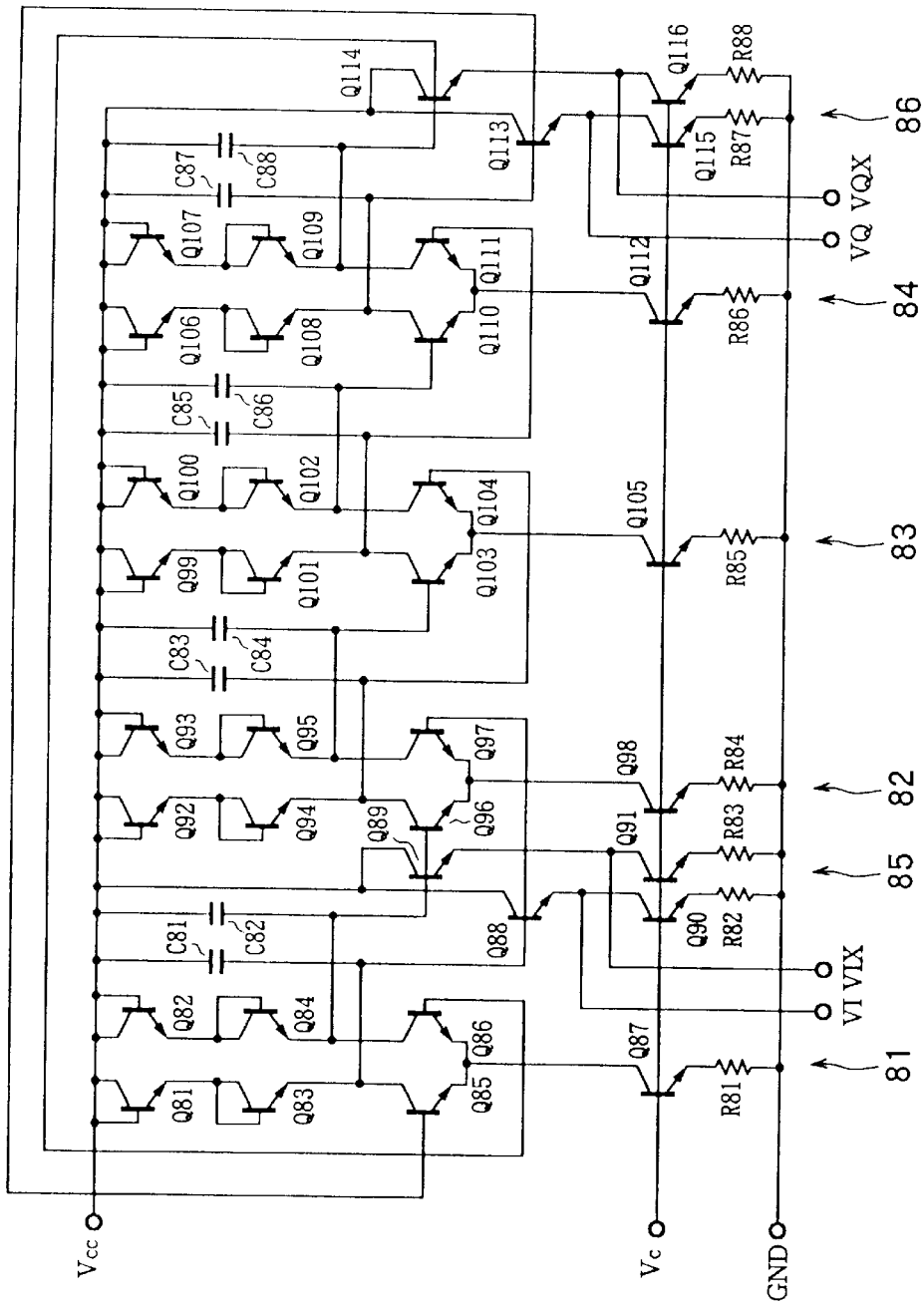
FIG. 9 is a circuit diagram of a voltage controlled oscillator according to a second embodiment of the present invention.

FIG. 9 is a circuit diagram of a voltage controlled oscillator according to a second embodiment of the present invention.

In this voltage controlled oscillator 80, there are four logic buffer circuits having the same structure as the logic buffer circuit in FIG. 2 and two serial diodes.

The first logic buffer circuit 81 comprises npn-type transistors Q81 to Q87, a resistor R81, and integrated capacitors C81 and C82.

The logic buffer circuit 81 has first and second diode arrays comprised of diode-connected transistors Q81 and Q83 and diode-connected transistors Q82 and Q84 connected in series as loads to the collectors of the differential transistors Q85 and Q86 serving as the emitter-coupled first and second transistors. Further, first and second integrated capacitors C81 and C82 are connected in parallel to the diode arrays connected between the supply line of the power source voltage Vcc and the collectors of the transistors Q85 and Q86. The connecting point of the emitters of the transistors Q85 and Q86 is connected to the collector of the transistor Q87, and the emitter of the transistor Q87 is connected to the ground line GND via the resistor R81.

A differential input is constituted by the base terminals of the first and the second transistors Q85 and Q86 comprising the differential transistor pair.

The second logic buffer circuit 82 comprises npn-type transistors Q92 to Q98, a resistor R84, and integrated capacitors C83 and C84.

The logic buffer circuit 82 has first and second diode arrays comprised of diode-connected transistors Q92 and Q94 and diode-connected transistors Q93 and Q95 connected in series as loads to the collectors of the differential transistors Q96 and Q97 serving as the emitter-coupled first and second transistors. Further, first and second integrated capacitors C83 and C84 are connected in parallel to the diode arrays connected between the supply line of the power source voltage Vcc and the collectors of the transistors Q96 and Q97. The connecting point of the emitters of the transistors Q96 and Q97 is connected to the collector of the transistor Q98. The emitter of the transistor Q98 is connected to the ground line GND via the resistor R84.

A differential input is constituted by the base terminals of the first and the second transistors Q96 and Q97 comprising the differential transistor pair and is connected to the collectors of the transistors Q85 and Q86 of the logic buffer circuit 81.

The third logic buffer circuit 83 comprises npn-type transistors Q99 to Q105, a resistor R85, and integrated capacitors C85 and C86.

The logic buffer circuit 83 has first and second diode arrays comprised of diode-connected transistors Q99 and Q101 and diode-connected transistors Q100 and Q102 connected in series as loads to the collectors of the differential transistors Q103 and Q104 serving as the emitter-coupled first and second transistors. Further, first and second integrated capacitors C85 and C86 are connected in parallel to the diode arrays connected between the supply line of the power source voltage Vcc and the collectors of the transistors Q103 and Q104. The connecting point of the emitters of the transistors Q103 and Q104 is connected to the collector of the transistor Q105. The emitter of the transistor Q105 is connected to the ground line GND via the resistor R85.

A differential input is constituted by the base terminals of the first and the second transistors Q103 and Q104 comprising the differential transistor pair and is connected to the collectors of the transistors Q96 and Q97 of the logic buffer circuit 82.

The fourth logic buffer circuit 84 comprises npn-type transistors Q106 to Q112, a resistor R86, and integrated capacitors C87 and C88.

The logic buffer circuit 84 has first and second diode arrays comprised of diode-connected transistors Q106 and Q108 and diode-connected transistors Q107 and Q109 connected in series as loads to the collectors of the differential transistors Q110 and Q111 serving as the emitter-coupled first and second transistors. Further, first and second integrated capacitors C87 and C88 are connected in parallel to the diode arrays connected between the supply line of the power source voltage Vcc and the collectors of the transistors Q110 and Q111. The connecting point of the emitters of the transistors Q110 and Q111 is connected to the collector of the transistor Q112. The emitter of the transistor Q112 is connected to the ground line GND via the resistor R86.

A differential input is constituted by the base terminals of the first and the second transistors Q110 and Q111 comprising the differential transistor pair and is connected to the collectors of the transistors Q103 and Q104 of the logic buffer circuit 83.

The collectors of the transistors Q110 and Q111 are respectively connected, that is, fed back, to the base terminals of the pair of differential transistors Q85 and Q86 of the logic buffer circuit 81.

In the voltage controlled oscillator 80, output buffers 85 and 86 are provided for every two logic buffer circuits in order to obtain two kinds of outputs VI/VIX and VQ/VQX. These are orthogonal to each other in phase and can be used as the signal sources for an orthogonal modulation/demodulation circuit.

The output buffer 85 comprises npn-type transistors Q88 to Q91 and resistors R82 and R83.

A base of the transistor Q88 is connected to the collector of the transistor Q85 of the logic buffer circuit 81, a collector is connected to the supply line of the power source voltage Vcc, an emitter is connected to the collector of the transistor Q90, and an emitter of the transistor Q90 is connected to the ground line GND via the resistor R82.

A base of the transistor Q89 is connected to the collector of the transistor Q86 of the logic buffer circuit 81, a collector is connected to the supply line of the power source voltage Vcc, an emitter is connected to a collector of the transistor Q91, and an emitter of the transistor Q91 is connected to the ground line GND via the resistor R83.

The transistors Q88 and Q89 constitute an emitter follower and are structured to obtain orthogonal outputs VI/VIX from the emitters.

The output buffer 86 comprises npn-type transistors Q113 to Q116 and resistors R87 and R88.

A base of the transistor Q113 is connected to the collector of the transistor Q110 of the logic buffer circuit 84, a collector is connected to the supply line of the power source voltage Vcc, an emitter is connected to a collector of the transistor Q115, and an emitter of the transistor Q115 is connected to the ground line GND via the resistor R87.

A base of the transistor Q114 is connected to the collector of the transistor Q 111, a collector is connected to the supply line of the power source voltage Vcc, an emitter is connected to a collector of the transistor Q 116, and an emitter of the transistor Q116 is connected to the ground line GND via the resistor R88.

The transistors Q113 and Q114 constitute an emitter follower and are structured to obtain orthogonal outputs VQ/VQX from the emitters.

Here, VC is a control terminal of the oscillation frequency which is connected to the bases of the transistors Q87, Q90, Q91, Q98, Q105, Q112, Q115, and Q116 constituting the current sources for the logic buffer circuits 81 to 84 and output buffers 85 and 86.

At the output buffers 85 and 86, the effects of output load are avoided by taking out the outputs via the emitter followers Q88, Q89 and Q113, Q114 provided at the outputs of the logic buffer circuits.

Note that while a slight delay will arise, it is also possible to place the emitter followers between the logic buffer circuits.

Next, an explanation will be made of modifications of the logic buffer circuits according to the present invention.

In above embodiments, it was necessary to provide at least two serial diodes in the first and second diode arrays.

It was because if there was only one diode, the gain would become 1 and the circuit would not oscillate. To meet the oscillation conditions even there is only one diode, it is necessary to increase the gain more than the gain of a simple emitter-coupled differential transistor pair.

Figure 10:
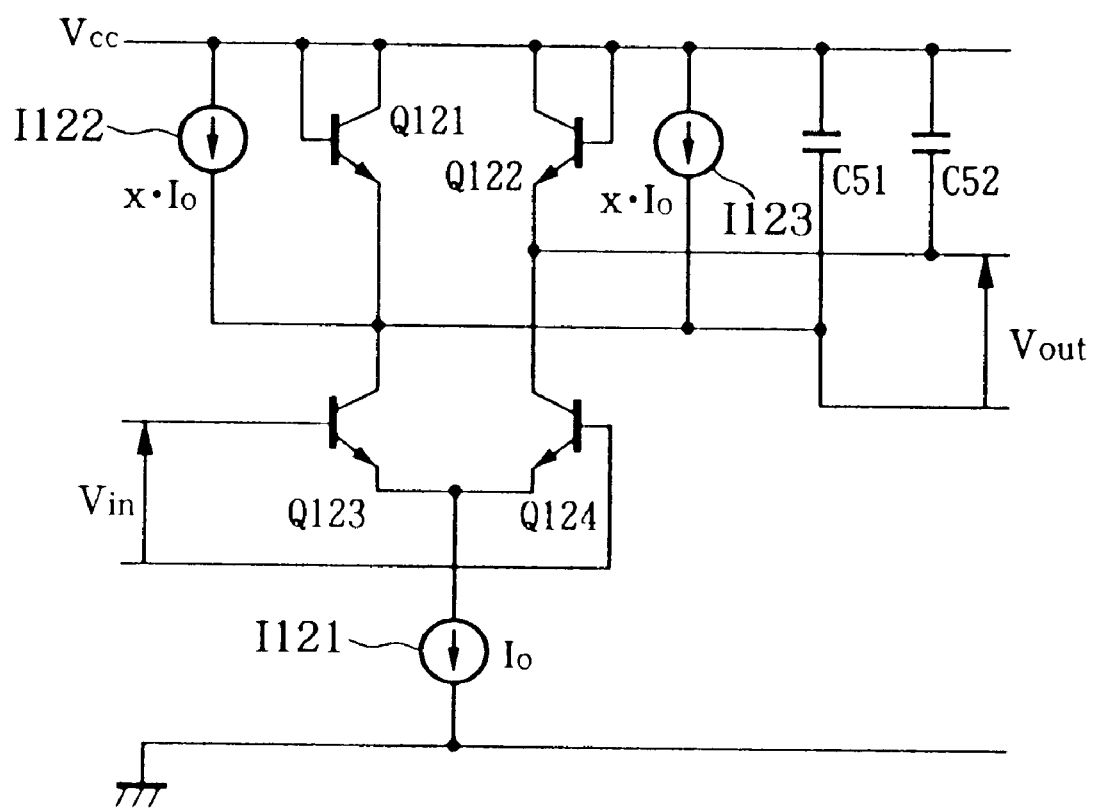
FIG. 10 is a circuit diagram of a logic buffer circuit according to a first modification of the present invention.

FIG. 10 is a circuit diagram of a first example of a modified logic buffer circuit.

In this example, as shown in FIG. 10, the current sources I122 and I123 (x·I0) are arranged in parallel with the diode arrays (transistors Q121 and Q122) and the current which flows in the diode array is reduced in order to increase the gain of the logic buffer circuit.

For example, if x=¼, the current which flows in the diode array becomes half, so a gain of 2 can be obtained even in a diode array constructed using one diode.

According to the basic configuration of the present invention, even if the diode array is made the minimum two diodes, the minimum operating voltage is about 2.5 to 2.7V.

As opposed to this, when using the logic buffer circuit in FIG. 10, it is possible to lower the operating voltage to about 2V.

Figure 11:
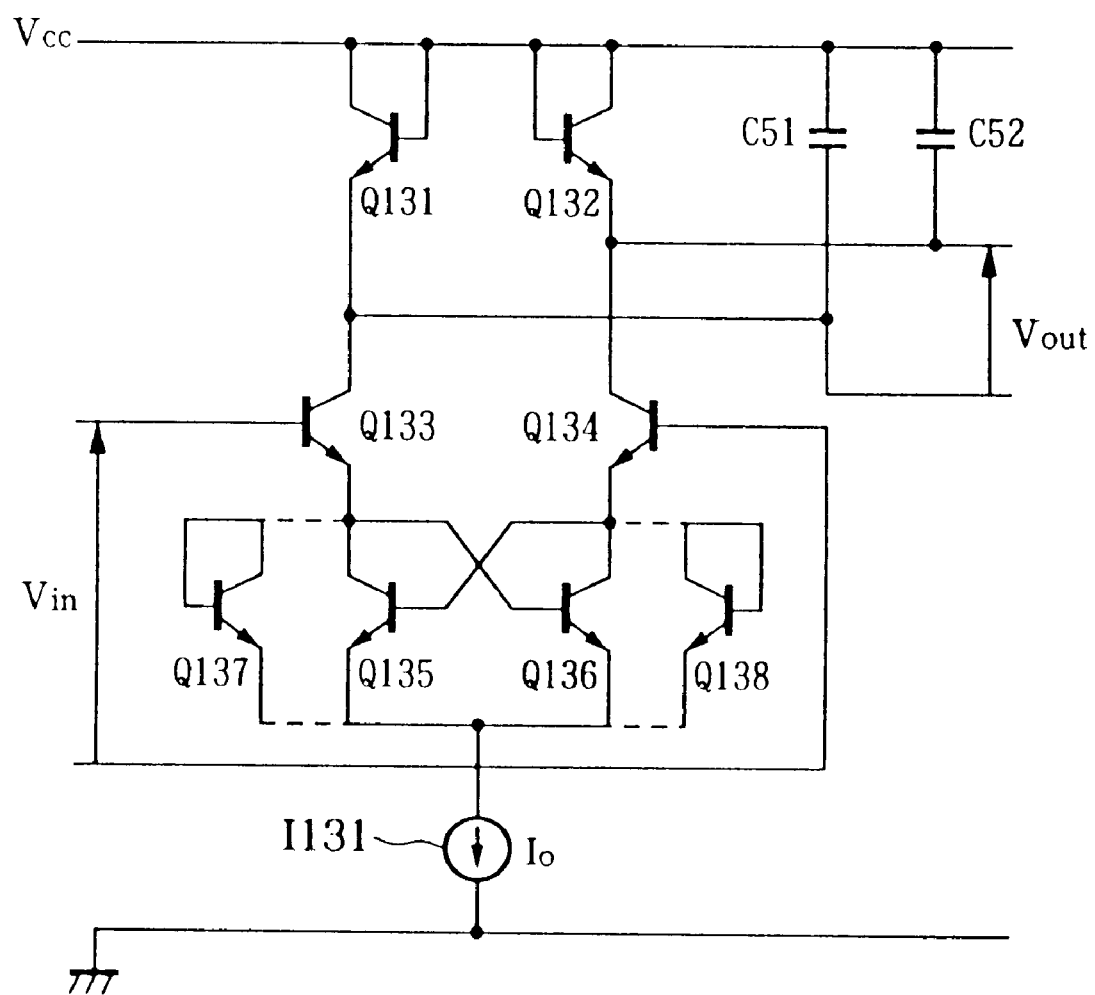
FIG. 11 is a circuit diagram of a logic buffer circuit according to a second modification of the present invention.
Figure 12:
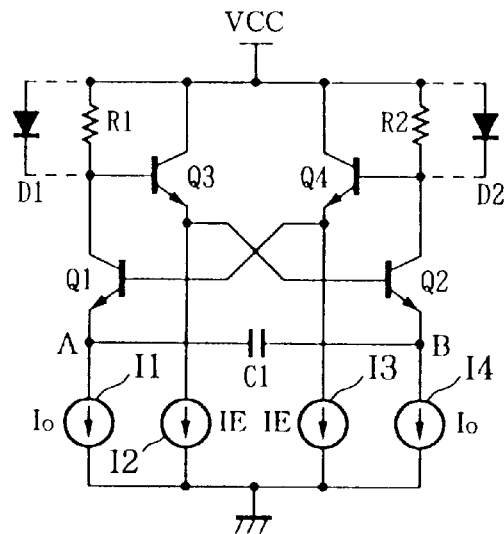
FIG. 12 is a circuit diagram of an emitter-coupled multi-vibrator type voltage controlled oscillator according to a first example of the related art.
Figure 13:
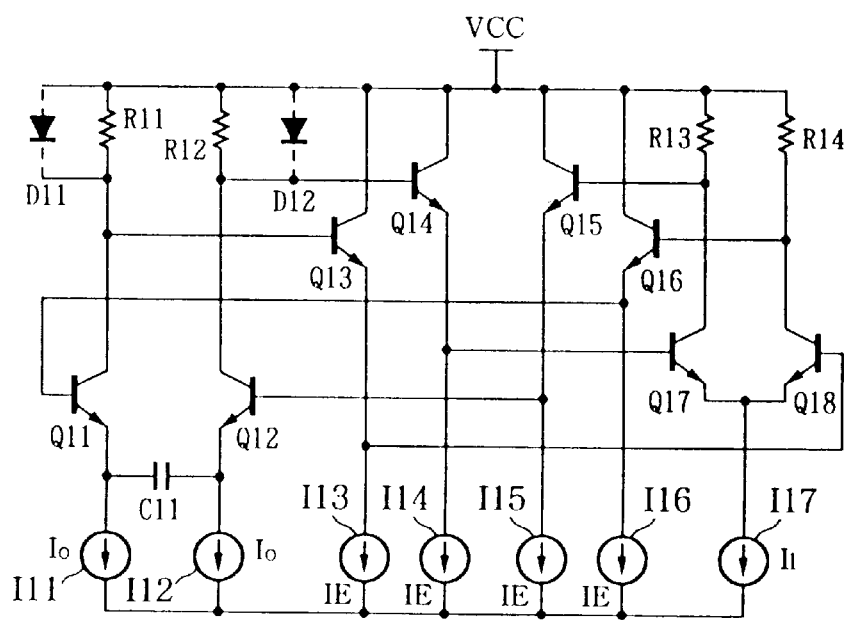
FIG. 13 is a circuit diagram of an improvement over the emitter-coupled multi-vibrator type voltage controlled oscillator of FIG. 12 according to a second example of the related art.
Figure 14A:
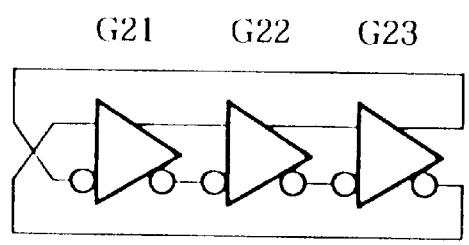
FIGS. 14A to 14D are views for explaining the principle of the ring oscillator type voltage controlled oscillator.
Figure 14B:
Figure 14C:
Figure 14D:
Figure 15:
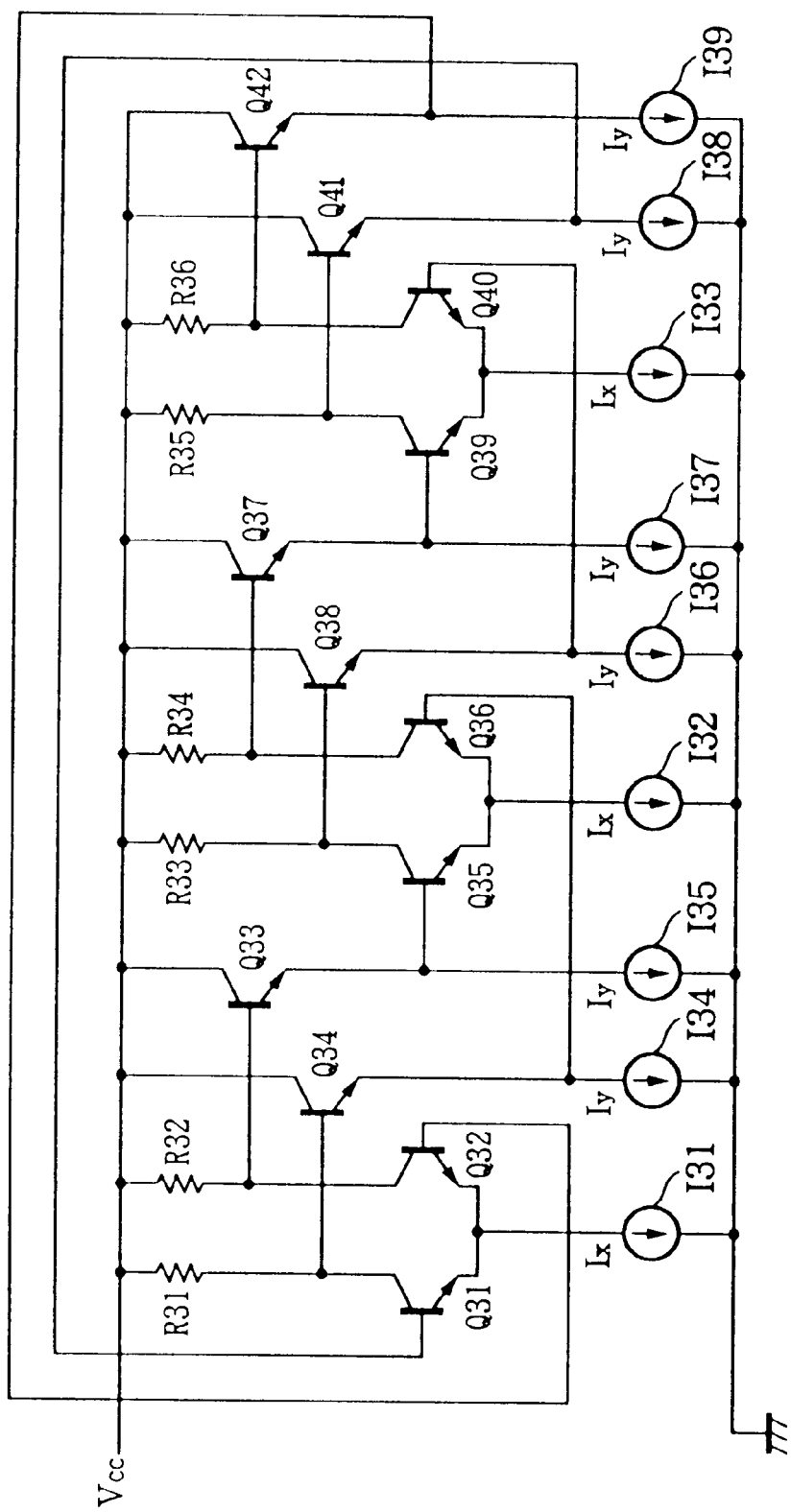
FIG. 15 is a circuit diagram of a ring oscillator type voltage controlled oscillator according to a first example of the related art.
Figure 16:
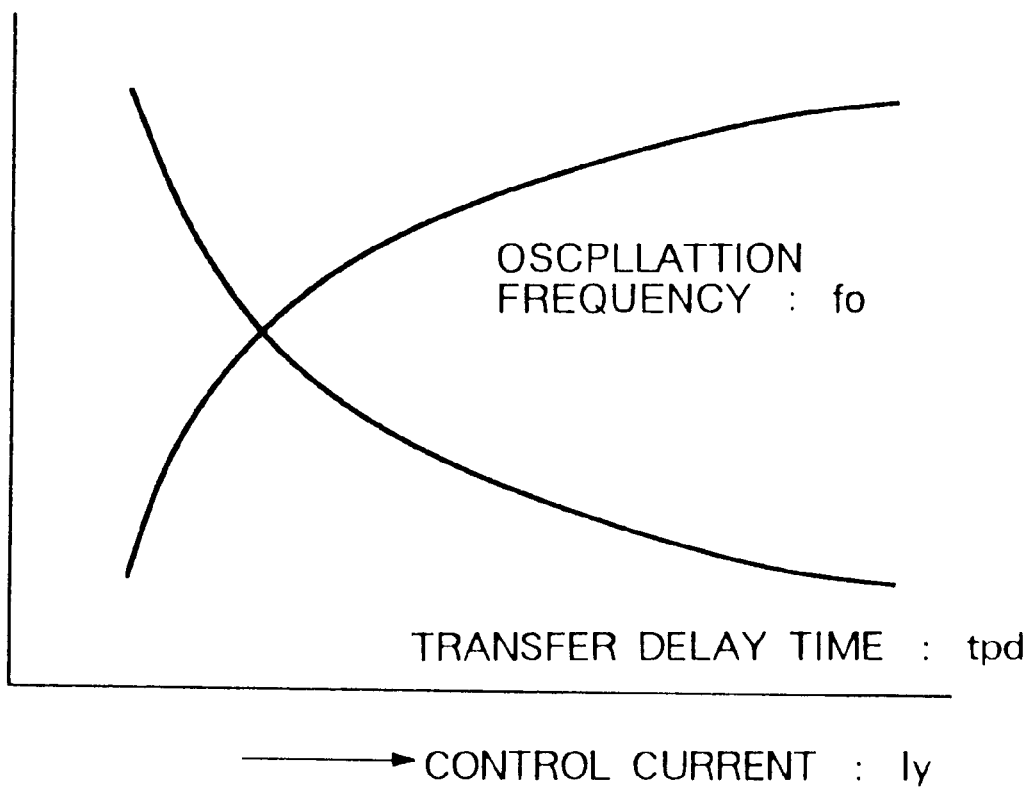
FIG. 16 is an explanatory view of the characteristics of the circuit of FIG. 15.
Figure 17:
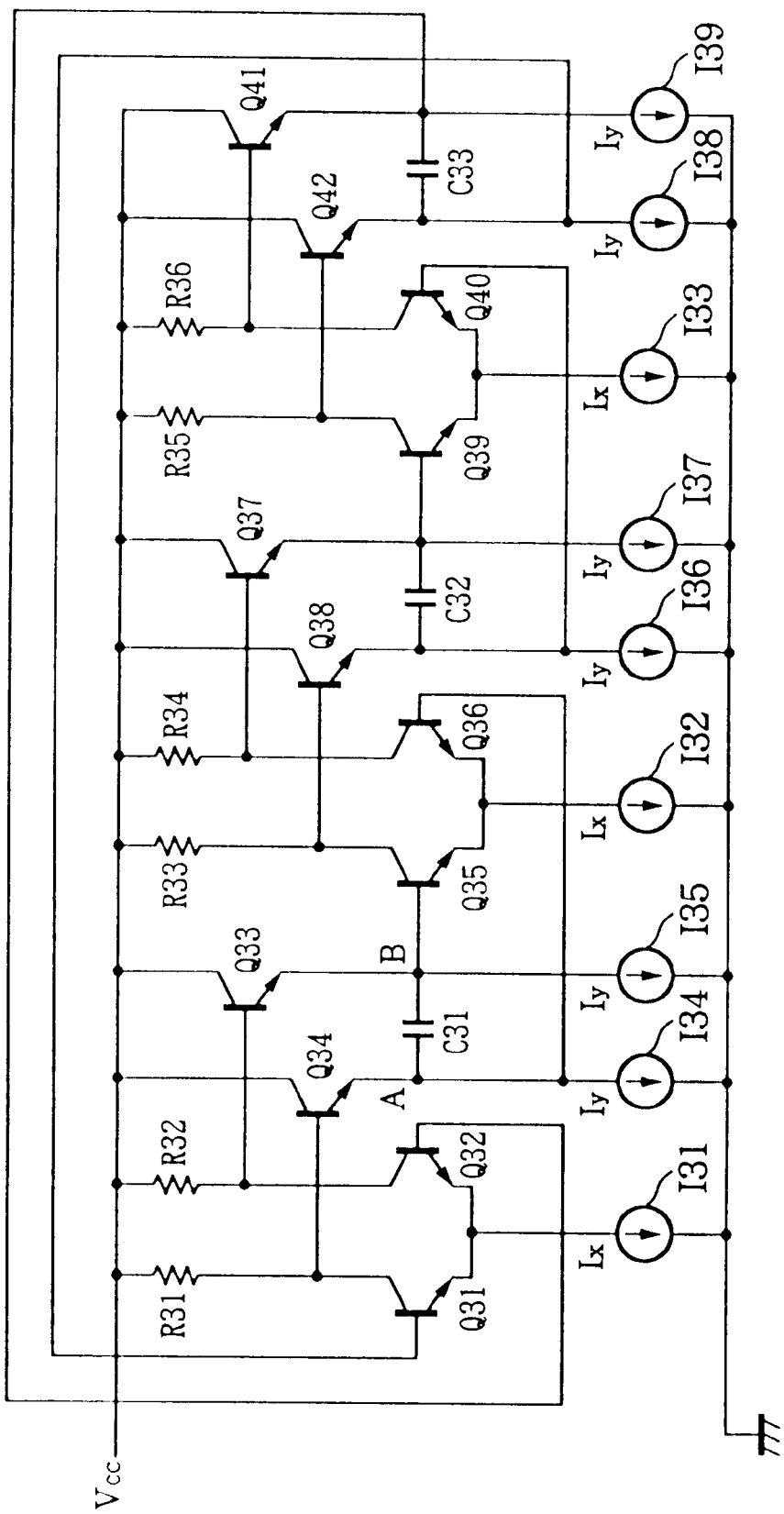
FIG. 17 is a circuit diagram of an improvement over the ring oscillator type voltage controlled oscillator of FIG. 15 according to a second example of the related art.
Figure 18:
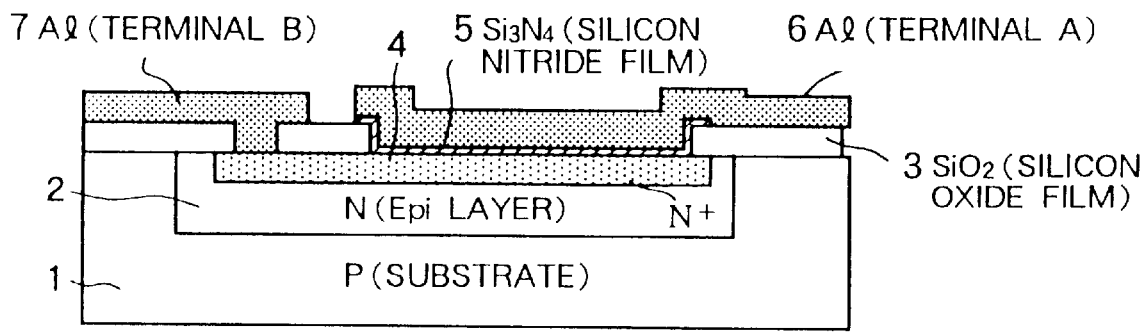
FIG. 18 is a view of a MIS capacitor as a representative example of a capacitor in an IC.
Figure 19:
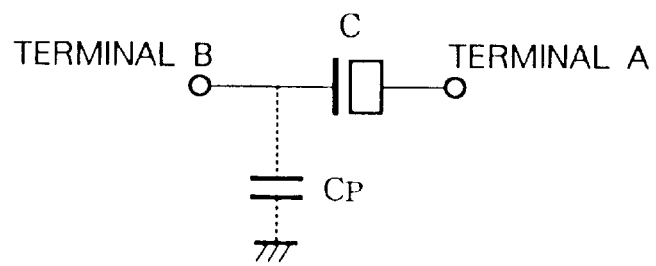
FIG. 19 is an equivalent circuit diagram of the case where a parasitic junction capacitance arises with the substrate at the silicon side of the MIS capacitor.
Figure 20:
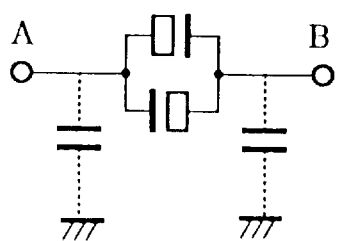
FIG. 20 is a view of an example of a configuration for connecting two MIS capacitors by antiparallel connection so that the parasitic capacitance also enter symmetrically and loss of the balanced operation is prevented.
Figure 21A:
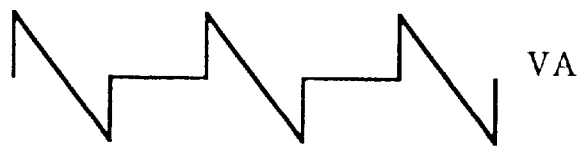
FIGS. 21A to 21C are views of the waveforms of the capacitor terminals A and B of FIG. 20.
Figure 21B:
Figure 21C:
Figure 22A:
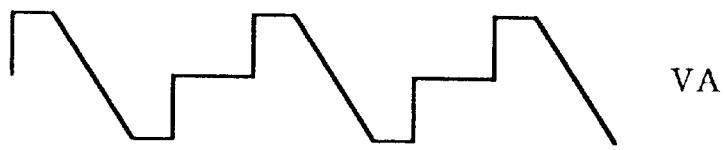
FIGS. 22A to 22C are views of the waveforms of the terminals A and B of the integrated capacitor C31 of the ring oscillation type circuit of FIG. 17.
Figure 22B:
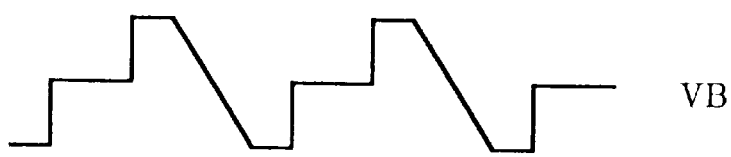
Figure 22C:
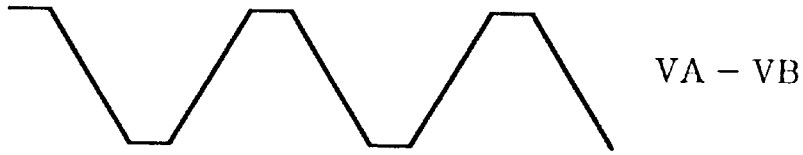
Figure 23:
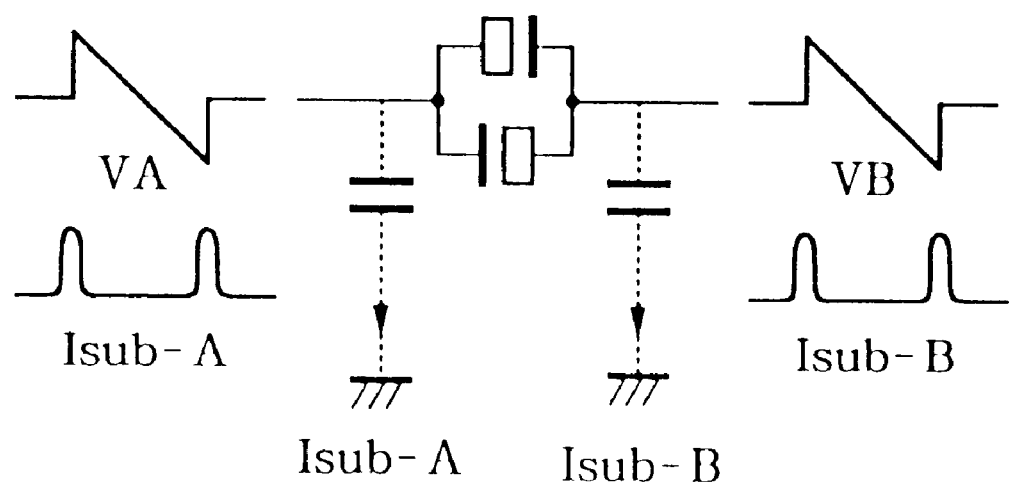
FIG. 23 is a diagram of an example of introduction of a considerably large spike current into the IC substrate through a parasitic capacitance.
Figure 24:
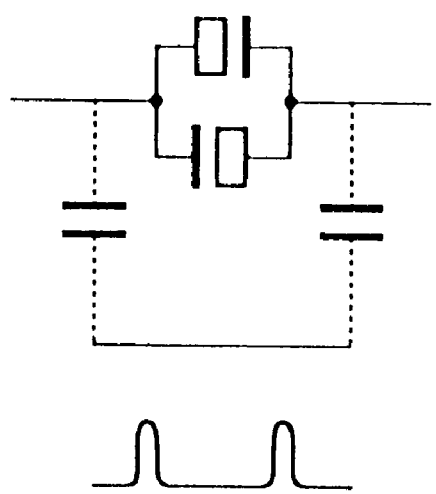
FIG. 24 is a view of an example of injecting a current to the circuit through a parasitic capacitance.

FIG. 11 is a circuit diagram of a second example of a modified logic buffer circuit.

In this modified example, to increase the gain of the pair of differential transistors Q133 and Q134, as shown in the figure, a circuit which cross connects the bases and collectors of the transistors Q135 and Q136 is inserted between the emitters of the transistors Q133 and Q134.

By applying this structure, the transfer conductance of the pair of differential transistors Q133 and Q134 appears to be infinite.

Accordingly, it is possible to meet the oscillation conditions even though if each diode array is comprised by one diode, such as shown by the transistors Q131 and Q132.

Furthermore, in this second modified example, the diodes comprised of the transistors Q137 and Q138 shown in FIG. 11 with a dotted line are connected in parallel to the transistors Q135 and Q136 and structured in order that the saturation current (emitter area) become a fraction of the saturation current of the transistors Q135/Q136.

In this way, by keeping the rate of increase of the transfer conductance within a finite range, it is possible to keep the deterioration of the characteristics small even at a considerably high oscillation frequency.

According to the present invention, the integrated capacitor which determines the delay time of the ring oscillator is used in a grounded (AC-like) form. Therefore, by setting the silicon side of an MIS structure capacitor to the ground side, it is possible to realize a considerably clean voltage controlled oscillator having the following characteristics which neither gives nor receives much interference to or from other circuits:

The oscillation signal does not enter the IC substrate via the parasitic capacitance of the MIS capacitor, therefore there is extremely little interference from other circuits.

When the potential of the IC substrate fluctuates due to the effects of other circuits, there is no effect received via the parasitic capacitance of the MIS capacitor.

The oscillation waveform is considerably close to a sine wave and there is little high frequency component.

No spike current ever flows to the power source terminals.

Further, there are only PN junction elements of transistors and diodes and integrated capacitors on the signal path. The current of the PN junction is scaled by the oscillation frequency (made proportional to the oscillation frequency).

Accordingly, the linearity of the oscillation frequency to the control voltage and current is excellent over an extremely wide range.

While the invention has been described with reference to specific embodiment chosen for purpose of illustration, it should be apparent that numerous modifications could be made thereto by those skilled in the art without departing from the basic concept and scope of the invention.

What is claimed is:

1. A voltage controlled oscillator formed as a ring oscillator, comprising:

n (n≧3) number of logical buffer circuits connected in series from a first logical buffer circuit to an n-th logical buffer circuit, each logical buffer circuit having a differential input terminal and a differential output terminal, wherein an i-th (1≦i<n) differential output terminal is connected to an i-th+1 differential input terminal, and wherein the differential output terminal of the n-th logical buffer circuit is made a negative feedback to the differential input terminal of said first logical buffer circuit, each said logical buffer circuit comprising:

a differential transistor pair including a first transistor and a second transistor, each differential transistor having an emitter terminal, a collector terminal, and a base terminal, wherein said base terminals comprise a differential input;

a first diode array including m (m>1) number of diodes connected in series, said first diode array being connected to said collector terminal of said first transistor;

a second diode array including m number of diodes connected in series, said second diode array being connected to said collector terminal of said second transistor;

a first capacitor, said first capacitor having a terminal connected to said collector terminal of said first transistor;

a second capacitor, said second capacitor having a terminal connected to said collector terminal of said second transistor;

a frequency control current source, said frequency control current source setting a sum of current flowing through said emitter terminals of said first and second transistors;

a first current source connected in parallel with said first diode array, said first current source supplying a current which is proportional to, and has a value not more than one-half of, said frequency control current source; and a second current source connected in parallel with said second diode array, said second current source supplying a current which is proportional to, and has a value not more than one-half of, said frequency control current source.

2. A voltage controlled oscillator as set forth in claim 1, wherein said emitter terminals of the first and second transistors are connected to each other and a connection point thereof is connected to said frequency control current source and the m number of diodes of the first and second diode arrays is two or more.

3. A voltage controlled oscillator as set forth in claim 1, wherein said first and second capacitors are metal insulator semiconductor (MIS) structure capacitors comprised of a metal film and silicon bulk sandwiching an insulating film wherein the metal film is connected to the collector terminal side of said first or second transistor, and the silicon bulk side is alternating-current grounded.

4. A voltage controlled oscillator as set forth in claim 1, further comprising:

a third transistor and a fourth transistor, a collector terminal of said third transistor being connected to a base terminal of said fourth transistor and said emitter terminal of said first transistor, a collector terminal of said fourth transistor being connected to a base terminal of said third transistor and said emitter terminal of said second transistor, and emitter terminals of said third and fourth transistors being connected to each other and a connection point thereof being connected to said frequency control current source.

5. A voltage controlled oscillator as set forth in claim 4, wherein the m number of diodes of said first and second diode arrays is two or more.

6. A voltage controlled oscillator formed as a ring oscillator, comprising:

n (n≧3) number of logical buffer circuits connected in series from a first logical buffer circuit to an n-th logical buffer circuit, each logical buffer circuit having a differential input terminal and a differential output terminal, wherein an i-th (1≦i<n) differential output terminal is connected to an i-th+1 differential input terminal, and wherein the differential output terminal of the n-th logical buffer circuit is made a negative feedback to the differential input terminal of said first logical buffer circuit, each said logical buffer circuit comprising:

a differential transistor pair including a first transistor and a second transistor, each differential transistor having, an emitter terminal, a collector terminal, and a base terminal, wherein said base terminals comprise a differential input and said emitter terminals are connected to each other at a common connection point;

a first diode array including m (m≧2) number of diodes connected in series, said first diode array being connected to said collector terminal of said first transistor;

a second diode array including m number of diodes connected in series, said second diode array being connected to said collector terminal of said second transistor;

a first capacitor, said first capacitor having a terminal connected to said collector terminal of said first transistor;

a second capacitor, said second capacitor having a terminal connected to said collector terminal of said second transistor;

a frequency control current source connected to said common connection point, said frequency control current source setting a sum of current flowing through said emitter terminals;

a first current source connected in parallel with said first diode array, said first current source supplying a current which is proportional to, and has a value not more than one-half of, said frequency control current source; and a second current source connected in parallel with said second diode array, said second current source supplying a current which is proportional to, and has a value not more than one-half of, said frequency control current source, wherein said emitter terminals of said first and second transistors are connected to each other and a connection point thereof is connected to said frequency control current source.

7. A voltage controlled oscillator as set forth in claim 6, wherein said first and second capacitors are metal insulator semiconductor (MIS) structure capacitors comprised of a metal film and silicon bulk sandwiching an insulating film wherein the metal film is connected to the collector terminal side of said first or second transistor, and the silicon bulk side is alternating-current grounded.

8. A voltage controlled oscillator as set forth in claim 6, further comprising:

a third transistor and a fourth transistor, a collector terminal of said third transistor being connected to a base terminal of said fourth transistor and said emitter terminal of said first transistor, a collector terminal of said fourth transistor being connected to a base terminal of said third transistor and said emitter terminal of said second transistor, and emitter terminals of said third and fourth transistors being connected to each other and a connection point thereof being connected to said frequency control current source.

9. A voltage controlled oscillator formed as a ring oscillator, comprising:

n (n>3) number of logical buffer circuits connected in series from a first logical buffer circuit to an n-th logical buffer circuit, each logical buffer circuit having a differential input terminal[s] and a differential output terminal, wherein an i-th (1<i<n) differential output terminal is connected to an i-th+1 differential input terminal, and wherein the differential output terminal of the n-th logical buffer circuit is made a negative feedback to the differential input terminal of the first logical buffer circuit, each said logical buffer circuit comprising:

a differential transistor pair comprising a first transistor and a second transistor, each differential transistor having, an emitter terminal, a collector terminal, and a base terminal, wherein said base terminals comprise a differential input;

a first diode array comprising m (m>1) number of diodes connected in series, said first diode array being connected to said collector terminal of said first transistor;

a second diode array comprising m number of diodes connected in series, said second diode array being connected to said collector terminal of said second transistor;

a first metal insulator semiconductor (MIS) capacitor comprising a metal film and silicon bulk sandwiching an insulating film, said first MIS capacitor having the metal film connected to said collector terminal of said first transistor and the silicon bulk is alternating-current grounded;

a second MIS capacitor comprising a metal film and silicon bulk sandwiching an insulating film, said second MIS capacitor having the metal film connected to said collector terminal of said second transistor and the silicon bulk alternating-current grounded; and a frequency control current source, said frequency control current source setting a sum of current flowing through said emitter terminals of said first and second transistors.

10. A voltage controlled oscillator formed as a ring oscillator, comprising:

n (n>3) number of logical buffer circuits connected in series from a first logical buffer circuit to an n-th logical buffer circuit, each logical buffer circuit having a differential input terminal[s] and a differential output terminal, wherein an i-th (1 <i<n) differential output terminal is connected to an i-th+1 differential input terminal, and wherein the differential output terminal of the n-th logical buffer circuit is made a negative feedback to the differential input terminal of the first logical buffer circuit, each said logical buffer circuit comprising:

a differential transistor pair comprising a first transistor and a second transistor, each differential transistor having, an emitter terminal, a collector terminal, and a base terminal, wherein said base terminals comprise a differential input;

a first diode array comprising m (m>1) number of diodes connected in series, said first diode array being connected to said collector terminal of said first transistor;

a second diode array comprising m number of diodes connected in series, said second diode array being connected to said collector terminal of said second transistor;

a first metal insulator semiconductor (MIS) capacitor comprising a metal film and silicon bulk sandwiching an insulating film, said first MIS capacitor having the metal film connected to said collector terminal of said first transistor and the silicon bulk is alternating-current grounded;

a second MIS capacitor comprising a metal film and silicon bulk sandwiching an insulating film, said second MIS capacitor having the metal film connected to said collector terminal of said second transistor and the silicon bulk alternating-current grounded; and a frequency control current source, said frequency control current source setting a sum of current flowing through said emitter terminals of said first and second transistors, wherein said emitter terminals of the first and second transistors are connected to each other and a connection point thereof is connected to said frequency control current source and the m number of diodes of the first and second diode arrays is two or more.

* * * * *

UNITED STATES PATENT AND TRADEMARK OFFICE
CERTIFICATE OF CORRECTION

PATENT NO.    : 6,081,166
DATED         : June 27, 2000
INVENTOR(S)   : Masayuki Katakura It is certified that error appears in the above-identified patent and that said Letters Patent is hereby corrected as shown below:

<u>Title page,</u>
The title should read;

[54] VOLTAGE CONTROLLED OSCILLATOR INCLUDING A PLURALITY OF BUFFER CIRCUITS

Signed and Sealed this

Twentieth Day of November, 2001

Attest:

*Nicholas P. Godici*

NICHOLAS P. GODICI
*Attesting Officer*     *Acting Director of the United States Patent and Trademark Office*